United States Patent
Dai

(10) Patent No.: US 9,800,215 B2
(45) Date of Patent: Oct. 24, 2017

(54) LOW NOISE AMPLIFIER

(71) Applicant: Shanghai Huahong Grace Semiconductor Manufacturing Corporation, Shanghai (CN)

(72) Inventor: Ruofan Dai, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/973,970

(22) Filed: Dec. 18, 2015

(65) Prior Publication Data

US 2016/0190991 A1 Jun. 30, 2016

(30) Foreign Application Priority Data

Dec. 30, 2014 (CN) .......................... 2014 1 0857355

(51) Int. Cl.
*H03F 3/04* (2006.01)
*H03F 3/193* (2006.01)
(Continued)

(52) U.S. Cl.
CPC ........... *H03F 3/193* (2013.01); *H03F 1/0261* (2013.01); *H03F 1/223* (2013.01);
(Continued)

(58) Field of Classification Search
CPC .. H03F 3/04; H03F 3/20; H03F 3/191; H03G 3/30
(Continued)

(56) References Cited

U.S. PATENT DOCUMENTS 7,315,205 B2* 1/2008 Kim ..................... H03F 1/0211
330/124 D
7,612,616 B2* 11/2009 Deng ................... H03F 1/0205
330/253
(Continued)

FOREIGN PATENT DOCUMENTS

CN 101282110 A 10/2008
CN 101951230 A 1/2011
(Continued)

OTHER PUBLICATIONS

First Chinese Office Action regarding Application No. 201410857355.2 dated Feb. 28, 2017. English translation provided by http://globaldossier.uspto.gov.

*Primary Examiner* — Henry Choe
(74) *Attorney, Agent, or Firm* — Harness, Dickey & Pierce, P.L.C.

(57) ABSTRACT

The embodiments of the present disclosure provide a low noise amplifier including: an input stage circuit; a bias circuit, adapted for providing bias to the input stage circuit; an output stage circuit; a first amplifier and a second amplifier; a first middle stage circuit, adapted for implementing inter-stage matching, signal coupling and isolation between the input stage circuit and the first amplifier; and a second middle stage circuit, adapted for implementing inter-stage matching between the first amplifier and the second amplifier, wherein the first middle stage circuit is coupled with the second middle stage circuit via the first amplifier, and the second middle stage circuit is coupled with the output stage circuit via the second amplifier. Accordingly, amplifier gain of LNA is improved without increasing power consumption.

11 Claims, 2 Drawing Sheets

(51) Int. Cl.
*H03F 1/02* (2006.01)
*H03F 1/22* (2006.01)

(52) U.S. Cl.
CPC .. *H03F 2200/294* (2013.01); *H03F 2200/318* (2013.01); *H03F 2200/451* (2013.01)

(58) Field of Classification Search
USPC ........................................ 330/296, 285, 302
See application file for complete search history.

(56) References Cited

U.S. PATENT DOCUMENTS

| | | | | |
|---|---|---|---|---|
| 8,149,050 | B2* | 4/2012 | Cabanillas | H03F 1/0277 330/302 |
| 8,536,950 | B2* | 9/2013 | Nejati | H03F 1/565 330/302 |
| 2004/0124926 | A1* | 7/2004 | Kang | H03F 3/605 330/302 |
| 2006/0267682 | A1* | 11/2006 | Grebennikov | H03F 1/0277 330/51 |
| 2007/0096805 | A1* | 5/2007 | Kim | H03F 1/0211 330/51 |
| 2007/0268073 | A1* | 11/2007 | Suzaki | H03F 1/56 330/295 |

FOREIGN PATENT DOCUMENTS

| | | |
|---|---|---|
| CN | 103117711 A | 5/2013 |
| CN | 103633946 A | 3/2014 |
| CN | 104158497 A | 11/2014 |

* cited by examiner

LOW NOISE AMPLIFIER

CROSS-REFERENCE TO RELATED APPLICATIONS

The present application claims priority to Chinese patent application No. 201410857355.2, filed on Dec. 30, 2014, and entitled "LOW NOISE AMPLIFIER", the entire disclosure of which is incorporated herein by reference.

TECHNICAL FIELD

The present disclosure generally relates to electronic circuit technology, and more particularly, to a low noise amplifier.

BACKGROUND

In the front-end design of a radio frequency receiver, a Low Noise Amplifier (LNA) is a necessary component, which determines reception sensitivity of the radio frequency receiver. Especially, for radio frequency receivers used in systems such as a GPS navigator, etc., received signals are transmitted by navigation satellites, which carry very small power because of signal channel environment and transmitting distance issues, so that LNAs of front-ends of the radio frequency receivers need to have an excellent Noise Factor (NF), and a relatively high amplifier gain is required, so as to guarantee the radio frequency receivers have an enough signal-to-noise ratio and good communication quality.

However, for current LNAs of the radio frequency receivers, it is difficult to improve amplifier gains of the current LNAs without increasing power consumption.

SUMMARY

Embodiments of the present disclosure aim to solve a problem that improving amplifier gain of LNA without increasing power consumption.

In order to solve the aforementioned problem, embodiments of the present disclosure provide a low noise amplifier, which may include:
  an input stage circuit;
  a bias circuit, adapted for providing bias to the input stage circuit;
  an output stage circuit;
  a first amplifier and a second amplifier;
  a first middle stage circuit, adapted for implementing inter-stage matching, signal coupling and isolation between the input stage circuit and the first amplifier; and
  a second middle stage circuit, adapted for implementing inter-stage matching between the first amplifier and the second amplifier,
  wherein the first middle stage circuit is coupled with the second middle stage circuit via the first amplifier, and the second middle stage circuit is coupled with the output stage circuit via the second amplifier.

In some embodiments, the input stage circuit may include: a first inductor, a second inductor, a first capacitor, a second capacitor and a first transistor;
  wherein a first end of the first inductor is coupled with a radio frequency signal and a second end of the first inductor is coupled with a first end of the first capacitor;
  wherein a second end of the first capacitor is coupled with a first end of the second capacitor and a control end of the first transistor;
  wherein a first electrode of the first transistor forms an output end of the input stage circuit;
  wherein a second electrode of the first transistor and a second end of the second capacitor are coupled with a first end of the second inductor; and
  wherein a second end of the second inductor is grounded.

In some embodiments, the bias circuit may include: a current source, a second transistor and a first resistor;
  wherein the current source is coupled with a first electrode and a control end of the second transistor, and a first end of the first resistor;
  wherein a second electrode of the second transistor is grounded; and
  wherein a second end of the first resistor is coupled with a gate of the first transistor.

In some embodiments, the first middle stage circuit may include: a third capacitor and a third inductor;
  wherein a first end of the third capacitor and a first end of the third inductor are coupled with an input end of the first middle stage circuit;
  wherein a second end of the third capacitor forms an output end of the first middle stage circuit; and
  wherein a second end of the third inductor is grounded.

In some embodiments, the second middle stage circuit may include: a fourth capacitor and a fourth inductor;
  wherein a first end of the fourth capacitor and a first end of the fourth inductor are coupled with an input end of the second middle stage circuit;
  wherein a second end of the fourth capacitor forms an output end of the second middle stage circuit; and
  wherein a second end of the fourth inductor is grounded.

In some embodiments, the output stage circuit may include: a fifth capacitor, a sixth capacitor and a fifth inductor;
  wherein a first end of the fifth capacitor, a first end of the sixth capacitor and a first end of the fifth inductor are coupled with an input end of the output stage circuit;
  wherein a second end of the fifth capacitor and a second end of the fifth inductor are grounded; and
  wherein a second end of the sixth capacitor forms an output end of the output stage circuit.

In some embodiments, the first amplifier is a NMOS transistor;
  wherein a gate of the first amplifier is coupled with the output end of the first middle stage circuit;
  wherein a drain of the first amplifier is coupled with the input end of the second middle stage circuit; and
  wherein a source of the first amplifier is grounded.

In some embodiments, the gate of the first amplifier is coupled with a voltage supplier via a second resistor.

In some embodiments, the second amplifier is a NMOS transistor;
  wherein a gate of the second amplifier is coupled with the output end of the second middle stage circuit;
  wherein a drain of the second amplifier is coupled with the input end of the output stage circuit; and
  wherein a source of the second amplifier is grounded.

In some embodiments, the gate of the second amplifier is coupled with the voltage supplier via a third resistor.

Compared to prior art, embodiments of the present disclosure possess following advantages.

In prior art, a current reused low noise amplifier has an output amplifier stage. However, in embodiments of the present disclosure, by equally distributing transconductance to the output amplifier stage of the current reused low noise amplifier, the first amplifier and the cascaded second amplifier are obtained. Further, equal current re-usage is performed to the first amplifier and the cascaded second amplifier, thus they can share the same input stage bias current. Transconductance and output resistance of the low noise amplifier are increased, so that an amplifier gain of the LNA may be improved without increasing power consumption, thereby improving sensitivity of a radio frequency receiver using the LNA.

DETAILED DESCRIPTION

While designing a front-end of a radio frequency receiver, a Low Noise Amplifier (LNA) is a necessary component, which determines reception sensitivity of the radio frequency receiver. Especially, for radio frequency receivers such as GPS navigator, etc., received signals are transmitted by navigation satellites, which carry very small power because of signal channel environment and transmitting distance issue, so that LNAs of front-ends of the radio frequency receivers need to have an excellent Noise Factor (NF), and a relatively high amplifier gain is required, so as to guarantee the radio frequency receivers has an enough signal-to-noise ratio and good communication quality. However, for current LNAs of the radio frequency receivers, it is difficult to improve amplifier gains of the current LNAs without increasing power consumption.

Embodiments of the present disclosure provide a low noise amplifier. By additionally implementing a first amplifier and a cascaded second amplifier and performing current re-usage to the first amplifier and the cascaded second amplifier, transconductance and output resistance of the low noise amplifier may be increased so that an amplifier gain of LNA may be improved without increasing power consumption. Thus, sensitivity of a radio frequency receiver is improved.

In order to clarify the objects, characteristics and advantages of the present disclosure, embodiments of the present disclosure will be described in detail in conjunction with the accompanying drawings.

Figure 1:
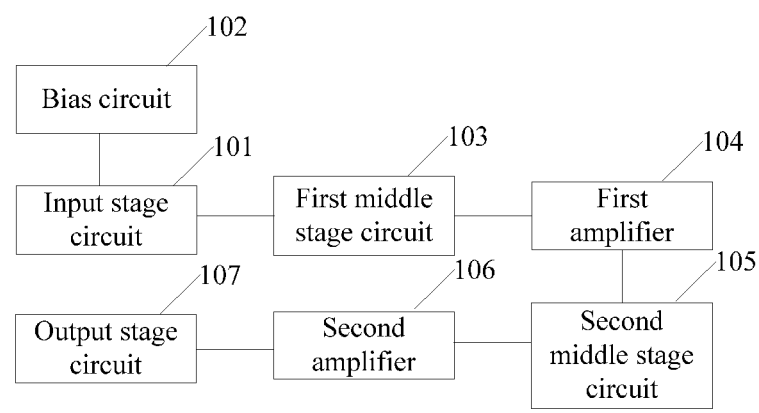
FIG. 1 schematically illustrates a structural diagram presenting a low noise amplifier according to one embodiment in the present disclosure.

The embodiments of the present disclosure provide a low noise amplifier. Referring to FIG. 1, the low noise amplifier may include: an input stage circuit 101, a bias circuit 102, a first middle stage circuit 103, a second middle stage circuit 105 and an output stage circuit 107. Wherein, the first middle stage circuit 103 is coupled with the second middle stage circuit 105 via a first amplifier 104, and the second middle stage circuit 105 is coupled with the output stage circuit 107 via a second amplifier 106.

The low noise amplifier may be applied to a radio frequency receiver such as a radio frequency receiver of GPS. In some embodiments, the input stage circuit 101 may match an antenna impedance of a radio frequency receiver. In some embodiments, the input stage circuit 101 may match a resistance of about 50 Ohm. The output stage circuit 107 may be used to drive off-chip load of a radio frequency receiver, thus correspondingly, the output stage circuit 107 may also match a resistance of about 50 Ohm.

Figure 2:
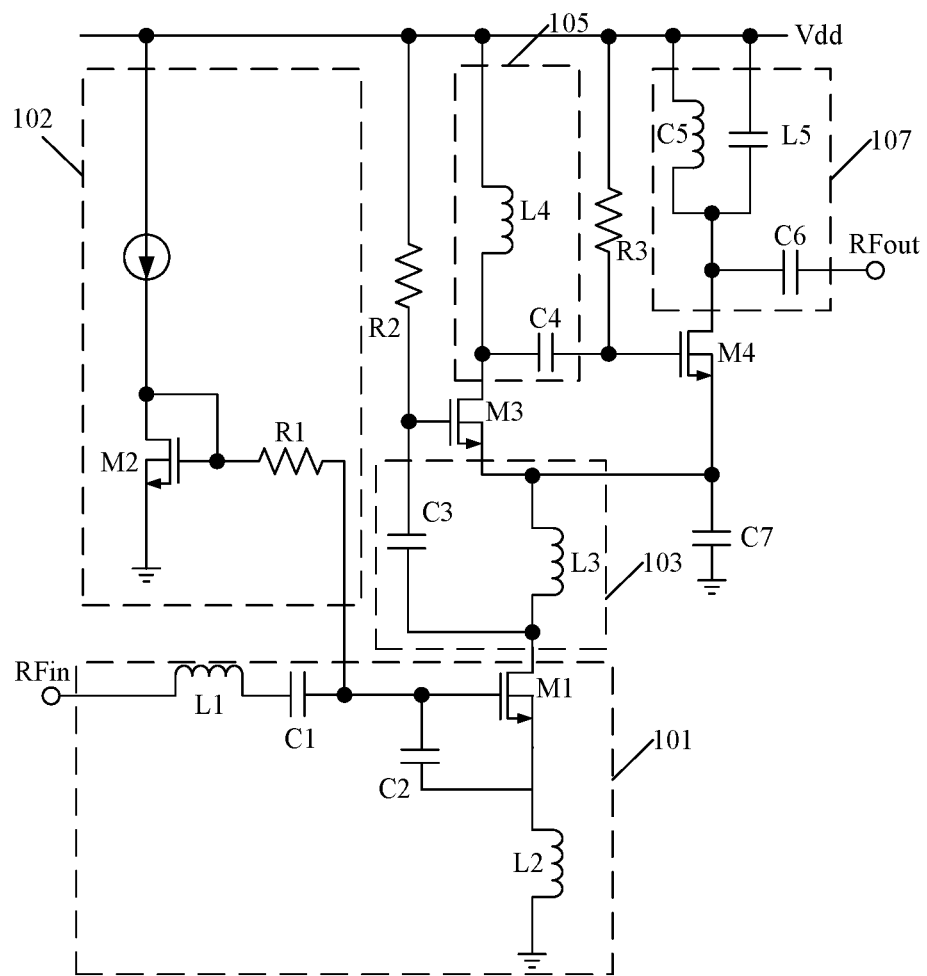
FIG. 2 schematically illustrates a structural diagram presenting a low noise amplifier according to another embodiment in the present disclosure.

In some embodiments, referring to FIG. 1 and FIG. 2, the input stage circuit 101 may include: a first inductor L1, a second inductor L2, a first capacitor C1, a second capacitor C2 and a first transistor M1; wherein a first end of the first inductor L1 is coupled with a radio frequency signal and a second end of the first inductor L1 is coupled with a first end of the first capacitor C1; wherein a second end of the first capacitor C1 is respectively coupled with a first end of the second capacitor C2 and a control end of the first transistor M1; wherein a first electrode of the first transistor M1 forms an output end of the input stage circuit 101; wherein a second electrode of the first transistor M1 and a second end of the second capacitor C2 are coupled with a first end of the second inductor L2; wherein a second end of the second inductor L2 is grounded. While inputting a radio signal RFin, the radio signal RFin may be converted to a current signal by the first transistor M1.

The bias circuit 102 may be used for providing bias voltage or bias current to the input stage circuit 101. In some embodiments, the bias circuit 102 may include: a current source, a second transistor M2 and a first resistor R1. Wherein, the current source is coupled with a first electrode of the second transistor M2, a control end of the second transistor M2 and a first end of the first resistor R1; a second electrode of the second transistor M2 is grounded. Wherein, a second end of the first resistor R1 is coupled with a gate of the first transistor M1. The bias circuit 102 may be used to modify voltage on the gate of the first transistor M1 so as to provide bias to the input stage circuit 101.

The first middle stage circuit 103 may be used for implementing inter-stage matching, signal coupling and isolation between the input stage circuit 101 and the first amplifier 104. The first middle stage circuit 103 may include: a third capacitor C3 and a third inductor L3. Wherein, a first end of the third capacitor C3 and a first end of the third inductor L3 are coupled with an input end of the first middle stage circuit 103; a second end of the third capacitor C3 forms an output end of the first middle stage circuit 103; a second end of the third inductor L3 is grounded.

The second middle stage circuit 105, which has a similar circuit structure to the first middle stage circuit 103, is used for implementing inter-stage matching between the first amplifier 104 and the second amplifier 106. Referring to FIG. 2, the second middle stage circuit 105 may include: a fourth capacitor C4 and a fourth inductor L4; wherein a first end of the fourth capacitor C4 and a first end of the fourth inductor L4 are coupled with an input end of the second middle stage circuit 105; a second end of the fourth capacitor C4 forms an output end of the second middle stage circuit 105; a second end of the fourth inductor L4 is grounded.

In some embodiments, the first amplifier 104 may be a MOS transistor. Referring to FIG. 2, the first amplifier 104 is a third transistor M3, which may be a NMOS transistor, wherein a gate of the third transistor M3 is coupled with the output end of the first middle stage circuit 103, a drain of the third transistor M3 is coupled with the input end of the second middle stage circuit 105, and a source of the third transistor M3 is grounded.

Wherein, the gate of the third transistor M3 is coupled with a voltage supplier via a second resistor R2. The second resistor R2 may be used for providing bias voltage and radio frequency impedance to the first amplifier 104.

In some embodiments, the second amplifier 106 may be a MOS transistor. Referring to FIG. 2, the second amplifier 106 is a fourth transistor M4, which may be a NMOS transistor, wherein a gate of the fourth transistor M4 is coupled with the output end of the second middle stage circuit 105, a drain of the fourth transistor M4 is coupled with the input end of the output stage circuit 107, and a source of the fourth transistor M4 is grounded.

Wherein, the gate of the fourth transistor M4 is coupled with the voltage supplier via a third resistor R3. The third resistor R3 may be used for providing bias voltage and radio frequency impedance to the second amplifier 106.

In some embodiments, referring to FIG. 2, the output stage circuit 107 may include: a fifth capacitor C5, a sixth capacitor C6 and a fifth inductor L5. Wherein, a first end of the fifth capacitor C5, a first end of the sixth capacitor C6 and a first end of the fifth inductor L5 are coupled with an input end of the output stage circuit 107; a second end of the fifth capacitor C5 and a second end of the fifth inductor L5 are grounded; a second end of the sixth capacitor C6 forms an output end of the output stage circuit 107.

Referring to FIG. 2, the third inductor L3 may provide radio frequency block of current reused, and a capacitor C7 may provide an Alternating Current (AC) bypass path to ground.

In prior art, there is only one middle stage circuit between the input stage circuit 101 and the output stage circuit 107 of the low noise amplifier, which is used for matching power in between, so that the low noise amplifier only includes one transistor amplifier of current reused stage. The embodiments of the present disclosure, by disposing two middle stage circuits between the input stage circuit 101 and the output stage circuit 107 and correspondingly setting a stack stages of current reused, the third transistor M3 and the fourth transistor M4 equally distribute a shared bias current Ib of the transistor amplifier of current reused stage to two common-source amplifiers stacked in cascade, which are the third transistor M3 and the fourth transistor M4. Due to the third transistor M3 and the fourth transistor M4 have a same bias state and a gate width ratio of the third transistor M3 and the fourth transistor M4 is a half of that of ordinary transistor of current reused stage, transconductance of the third transistor M3 and that of the fourth transistor M4 are identical, where gm3=gm4, which is a half of transconductance of the transistor amplifier of current reused stage.

gm1 represents transcondutance of the first transistor M1, and equivalent transconductance of the input stage is obtained that:

$$\frac{g_{m1}}{SL_2(SC_{gs,m1}+g_{m1})+1},$$

where $SL_2$ represents impedance of the second inductor L2 and $SC_{gs,m1}$ represents gate-source impedance of the first transistor M1.

gm3 represents transcondutance of the first transistor M3, so that gain of the first middle stage circuit 103 is $g_{m3}(SC_{gs,m3}\|SL_3)$, where $SL_3$ represents impedance of the third inductor L3 and $SC_{gs,m3}$ represents gate-source impedance of the first transistor M3, $SC_{gs,m3}\|SL_3$ represents impedance after the third inductor L3 and the third transistor M3 are parallel connected with gate-source ends thereof.

gm4 represents transcondutance of the first transistor M4, so that gain of the second middle stage circuit 105 is $g_{m3}(SC_{gs,m4}\|SL_4)$, where $SL_4$ represents impedance of the fourth inductor L4 and $SC_{gs,m4}$ represents gate-source impedance of the fourth transistor M4, $SC_{gs,m4}\|SL_4$ represents impedance after the fourth inductor L4 and the fourth transistor M4 are parallel connected with gate-source ends thereof.

The output stage circuit 107 has a impedance of $SC_5\|SL_5$, where $SC_5$ represents impedance of the fifth capacitor C5 and $SL_5$ represents impedance of the fifth inductor L5.

Therefore, via the approximation analysis of small signals, it is known that a gain $A_{NCR}$ of the embodiments of the present disclosure is obtained that:

$$A_{NCR}=\frac{g_{m1}\times g_{m2}\times g_{m3}}{SL_2(SC_{gs,mx}+g_{min})+1}\times(C_{gs,m2}\|L_3)\times(C_{gs,m0}\|L_4)\times(C_5\|L_5);$$

however, a gain $A_{CR}$ of current ordinary structure with current re-usage is expressed as:

$$A_{CR}=\frac{g_{m1}\times g_{m3}}{SL_2(SC_{gs,m1}+g_{m1})+1}\times(C_{gs,mx}\|L_3)\times SL_4;$$

where $g_{mx}$ represents transconductance of the transistor amplifier of current reused stage, $C_{gs,mx}$ represents impedance between a gate and a source of the transistor amplifier of current reused stage.

Accordingly, a gain improvement effect $A_E$ is obtained that:

$$A_E=\frac{A_{NCR}}{A_{CR}}=-\frac{g_{m4}}{4}\times(C_5\|L_5).$$

The embodiments of the present disclosure provide a low noise amplifier which can be applied to a radio frequency receiver, where the low noise amplifier, by increasing the stack stage of output common source sharing and equally distributing the bias current Ib, and then equally distributes transconductance and improve overall transconductance of circuit after cascade, so that the amplifier gain is improved without increasing power consumption so as to realize high amplifier gain with low power consumption.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A low noise amplifier, comprising:
an input stage circuit;
a bias circuit, adapted for providing bias to the input stage circuit;
an output stage circuit;
a first amplifier;
a second amplifier;
a first middle stage circuit, adapted for implementing inter-stage matching, signal coupling, and isolation between the input stage circuit and the first amplifier; and
a second middle stage circuit, adapted for implementing inter-stage matching between the first amplifier and the second amplifier,
wherein the first middle stage circuit is coupled with the second middle stage circuit via the first amplifier, wherein the second middle stage circuit is coupled with the output stage circuit via the second amplifier, wherein the first middle stage circuit includes a third inductor, wherein a first end of the third inductor (i) forms an input end of the first middle stage circuit and (ii) is coupled with an output end of the input stage circuit, and wherein a second end of the third inductor (i) is connected with the first amplifier and the second amplifier and (ii) is coupled to ground via a seventh capacitor, wherein the input stage circuit includes: a first inductor, a second inductor, a first capacitor, a second capacitor, and a first transistor;

wherein a first end of the first inductor is coupled with a radio frequency signal and a second end of the first inductor is coupled with a first end of the first capacitor;

wherein a second end of the first capacitor is coupled with a first end of the second capacitor and a control end of the first transistor;

wherein a first electrode of the first transistor forms an output end of the input stage circuit;

wherein a second electrode of the first transistor and a second end of the second capacitor are coupled with a first end of the second inductor; and wherein a second end of the second inductor is grounded.

2. The low noise amplifier according to claim 1, wherein the bias circuit includes a current source, a second transistor, and a first resistor;

wherein the current source is coupled with a first electrode of the second transistor, a control end of the second transistor, and a first end of the first resistor;

wherein a second electrode of the second transistor is grounded; and wherein a second end of the first resistor is coupled with a gate of the first transistor.

3. The low noise amplifier according to claim 1, wherein the first middle stage circuit further includes: a third capacitor;

wherein a first end of the third capacitor is coupled with the input end of the first middle stage circuit; and wherein a second end of the third capacitor forms an output end of the first middle stage circuit.

4. The low noise amplifier according to claim 1, wherein the second middle stage circuit includes a fourth capacitor and a fourth inductor;

wherein a first end of the fourth capacitor and a first end of the fourth inductor are coupled with an input end of the second middle stage circuit;

wherein a second end of the fourth capacitor forms an output end of the second middle stage circuit; and wherein a second end of the fourth inductor is grounded.

5. The low noise amplifier according to claim 1, wherein the output stage circuit includes: a fifth capacitor, a sixth capacitor and a fifth inductor;

wherein a first end of the fifth capacitor, a first end of the sixth capacitor, and a first end of the fifth inductor are coupled with an input end of the output stage circuit;

wherein a second end of the fifth capacitor and a second end of the fifth inductor are grounded; and wherein a second end of the sixth capacitor forms an output end of the output stage circuit.

6. The low noise amplifier according to claim 1, wherein the first amplifier is an NMOS transistor;

wherein a gate of the first amplifier is coupled with an output end of the first middle stage circuit;

wherein a drain of the first amplifier is coupled with an input end of the second middle stage circuit; and wherein a source of the first amplifier is grounded.

7. The low noise amplifier according to claim 6, wherein the gate of the first amplifier is coupled with a voltage supplier via a second resistor.

8. The low noise amplifier according to claim 1, wherein the second amplifier is an NMOS transistor;

wherein a gate of the second amplifier is coupled with an output end of the second middle stage circuit;

wherein a drain of the second amplifier is coupled with an input end of the output stage circuit; and wherein a source of the second amplifier is grounded.

9. The low noise amplifier according to claim 8, wherein the gate of the second amplifier is coupled with a voltage supplier via a third resistor.

10. A low noise amplifier, comprising:

an input stage circuit;

a bias circuit, adapted for providing bias to the input stage circuit;

an output stage circuit;

a first amplifier;

a second amplifier;

a first middle stage circuit, adapted for implementing inter-stage matching, signal coupling, and isolation between the input stage circuit and the first amplifier; and a second middle stage circuit, adapted for implementing inter-stage matching between the first amplifier and the second amplifier, wherein the first middle stage circuit is coupled with the second middle stage circuit via the first amplifier, and the second middle stage circuit is coupled with the output stage circuit via the second amplifier, wherein the input stage circuit includes: a first inductor, a second inductor, a first capacitor, a second capacitor and a first transistor, wherein a first end of the first inductor is coupled with a radio frequency signal and a second end of the first inductor is coupled with a first end of the first capacitor, wherein a second end of the first capacitor is coupled with a first end of the second capacitor and a control end of the first transistor, wherein a first electrode of the first transistor forms an output end of the input stage circuit, wherein a second electrode of the first transistor and a second end of the second capacitor are coupled with a first end of the second inductor, and wherein a second end of the second inductor is grounded.

11. The low noise amplifier according to claim 10, wherein the bias circuit includes:

a current source;

a second transistor; and a first resistor, wherein the current source is coupled with a first electrode of the second transistor, a control end of the second transistor, and a first end of the first resistor, wherein a second electrode of the second transistor is grounded, and wherein a second end of the first resistor is coupled with a gate of the first transistor.

* * * * *